US010042449B2

(12) United States Patent
Wu

(10) Patent No.: US 10,042,449 B2
(45) Date of Patent: *Aug. 7, 2018

(54) METHOD FOR MANUFACTURING INPUT ASSEMBLY, INPUT ASSEMBLY AND TERMINAL

(71) Applicant: GUANGDONG OPPO MOBILE TELECOMMUNICATIONS CORP., LTD., Dongguan (CN)

(72) Inventor: Shoukuan Wu, Dongguan (CN)

(73) Assignee: GUANGDONG OPPO MOBILE TELECOMMUNICATIONS CORP., LTD., Dongguan, Guangdong (CN)

(*) Notice: Subject to any disclaimer, the term of this patent is extended or adjusted under 35 U.S.C. 154(b) by 0 days.

This patent is subject to a terminal disclaimer.

(21) Appl. No.: 15/836,543

(22) Filed: Dec. 8, 2017

(65) Prior Publication Data

US 2018/0101254 A1 Apr. 12, 2018

Related U.S. Application Data

(63) Continuation of application No. 15/619,763, filed on Jun. 12, 2017.

(30) Foreign Application Priority Data

Aug. 16, 2016 (CN) .......................... 2016 1 0678007

(51) Int. Cl.
*G06F 3/041* (2006.01)
*H05K 1/18* (2006.01)
(Continued)

(52) U.S. Cl.
CPC ............ *G06F 3/041* (2013.01); *G06F 1/1626* (2013.01); *G06F 1/1633* (2013.01);
(Continued)

(58) Field of Classification Search
CPC ...... G06F 3/041; G06F 1/1626; G06F 1/1633; G06F 1/1643; G06F 1/1656;
(Continued)

(56) References Cited

U.S. PATENT DOCUMENTS 8,264,463 B2 * 9/2012 Takashima ............ G06F 3/0224
345/169
8,736,001 B2 * 5/2014 Salatino ............ G06K 9/00053
257/415
(Continued)

FOREIGN PATENT DOCUMENTS

CN 103507561 A 1/2014
CN 105045447 A 11/2015
(Continued)

OTHER PUBLICATIONS

The European Patent Office, Extended European Search Report for EP Application 17176616.5, dated Nov. 17, 2017, 4 pages.
(Continued)

*Primary Examiner* — Peter D McLoone
(74) *Attorney, Agent, or Firm* — Hodgson Russ LLP

(57) ABSTRACT

A method for manufacturing an input assembly, an input assembly and a terminal are provided. The input assembly includes a decoration enclosure, a touch panel, a fingerprint chip package structure and a display screen component, and the touch panel defines a blind hole in a lower surface thereof. The method for manufacturing the input assembly includes: mounting the fingerprint chip package structure in the decoration enclosure; mounting the decoration enclosure carried with the fingerprint chip package structure in the blind hole; mounting the display screen component to the lower surface of the touch panel, in which a first orthographic projection of the display screen component in the lower surface of the touch panel overlaps a second ortho- (Continued)

graphic projection of the decoration enclosure in the lower surface of the touch panel.

20 Claims, 6 Drawing Sheets

(51) Int. Cl.
    *G06F 1/16*         (2006.01)
    *H05K 3/28*         (2006.01)
    *G06K 9/00*         (2006.01)
    *H05K 3/32*         (2006.01)
    *H05K 1/02*         (2006.01)
    *H04W 88/02*       (2009.01)

(52) U.S. Cl.
    CPC .......... *G06F 1/1643* (2013.01); *G06F 1/1656* (2013.01); *G06K 9/00006* (2013.01); *H05K 1/028* (2013.01); *H05K 1/189* (2013.01); *H05K 3/284* (2013.01); *H05K 3/32* (2013.01); *G06F 2203/04103* (2013.01); *H04W 88/02* (2013.01); *H05K 2201/10287* (2013.01); *H05K 2203/1316* (2013.01)

(58) Field of Classification Search
    CPC ...... G06F 2203/04103; G06K 9/00006; H05K 1/028; H05K 1/189; H05K 3/284; H05K 3/32; H05K 2201/10287; H05K 2203/1316; H04W 88/02
    See application file for complete search history.

(56) References Cited

U.S. PATENT DOCUMENTS

| | | | | |
|---|---|---|---|---|
| 9,001,081 | B2* | 4/2015 | Pope | G06F 3/044 345/174 |
| 9,030,440 | B2* | 5/2015 | Pope | G06F 3/044 345/174 |
| 9,135,495 | B1* | 9/2015 | Pope | G06F 3/044 |
| 9,268,989 | B2* | 2/2016 | Pope | G06F 3/044 |
| 9,576,178 | B2* | 2/2017 | Pope | G06F 3/044 |
| 9,639,224 | B2* | 5/2017 | Lee | G06K 9/0002 |
| 9,697,409 | B2* | 7/2017 | Myers | G06K 9/0002 |
| 9,772,730 | B2* | 9/2017 | Lee | G06F 3/044 |
| 9,811,713 | B2* | 11/2017 | Pi | H04L 63/0861 |
| 9,886,613 | B2* | 2/2018 | Pi | G06K 9/0002 |
| 2009/0079698 | A1* | 3/2009 | Takashima | G06F 3/0224 345/169 |
| 2011/0309482 | A1* | 12/2011 | Salatino | G06K 9/00053 257/659 |
| 2013/0307818 | A1* | 11/2013 | Pope | G06F 3/044 345/174 |
| 2014/0216914 | A1* | 8/2014 | Pope | G06F 3/044 200/600 |
| 2015/0036065 | A1* | 2/2015 | Yousefpor | G06K 9/228 349/12 |
| 2015/0071509 | A1 | 3/2015 | Myers | |
| 2015/0146944 | A1* | 5/2015 | Pi | H04L 63/0861 382/124 |
| 2015/0242675 | A1* | 8/2015 | Pope | G06F 3/044 382/124 |
| 2015/0363629 | A1* | 12/2015 | Lee | G06K 9/0002 345/173 |
| 2015/0371076 | A1* | 12/2015 | Lee | G06F 3/041 382/124 |
| 2016/0004896 | A1* | 1/2016 | Pope | G06F 3/044 382/124 |
| 2016/0004899 | A1* | 1/2016 | Pi | G06F 1/1626 345/173 |
| 2016/0224178 | A1* | 8/2016 | Yang | G06K 9/00013 |
| 2016/0267313 | A1* | 9/2016 | Pope | G06F 3/044 |
| 2017/0344788 | A1* | 11/2017 | Lee | G06F 3/0412 |
| 2017/0372115 | A1* | 12/2017 | Lee | G06F 3/044 |
| 2018/0005007 | A1* | 1/2018 | Du | G06K 9/0004 |
| 2018/0052538 | A1* | 2/2018 | Wu | G06F 3/041 |
| 2018/0052539 | A1* | 2/2018 | Wu | G06F 3/041 |
| 2018/0052561 | A1* | 2/2018 | Wu | G06F 3/0416 |
| 2018/0053035 | A1* | 2/2018 | Wu | G06K 9/00053 |
| 2018/0054313 | A1* | 2/2018 | Wu | H04L 9/3231 |

FOREIGN PATENT DOCUMENTS

| | | |
|---|---|---|
| CN | 105303177 A | 2/2016 |
| CN | 105512652 A | 4/2016 |
| CN | 205318405 U | 6/2016 |
| CN | 105759913 A | 7/2016 |
| CN | 205405465 U | 7/2016 |
| CN | 105825165 A | 8/2016 |
| CN | 106293239 A | 1/2017 |
| KR | 20150013981 A | 2/2015 |
| KR | 10639997 B1 | 7/2016 |

OTHER PUBLICATIONS

The State Intellectual Property Office of People's Republic of China, Office Action and Notification of Grant for CN Application 201610678007.8, dated Oct. 9, 2017.

The World Intellectual Property Organization, English Translation of International Search Report and Written Opinion of the International Searching Authority, dated Oct. 11, 2017.

* cited by examiner

METHOD FOR MANUFACTURING INPUT ASSEMBLY, INPUT ASSEMBLY AND TERMINAL

CROSS-REFERENCE TO RELATED APPLICATION

This application is a continuation of U.S. application Ser. No. 15/619,763, filed on Jun. 12, 2017, which is based on and claims a priority to Chinese Patent Application Serial No. 201610678007.8, filed on Aug. 16, 2016, the entire contents of which are incorporated herein by reference.

FIELD

The present disclosure relates to a field of terminal, and more particularly to a method for manufacturing an input assembly, an input assembly and a terminal.

BACKGROUND

In the related art, with people paying more and more attention to privacy in a terminal, a fingerprint identification technology is widely applied to the terminal. In general, the terminal includes a fingerprint chip package structure so as to enhance safety of the terminal and to prevent an unauthorized user from using the terminal.

SUMMARY

According to a first aspect of embodiments of the present disclosure, there is provided a method for manufacturing an input assembly. The input assembly includes a decoration enclosure, a touch panel, a fingerprint chip package structure and a display screen component. The touch panel defines a blind hole in a lower surface thereof. The decoration enclosure includes a decoration ring. The decoration ring is provided with a muff-coupling portion connected to a bottom surface of the decoration ring. The muff-coupling portion is provided with a flange fitted over the muff-coupling portion. The flange includes a protrusion portion protruding from an outer wall of the decoration enclosure. The flange and the decoration ring are configured as separate structures. The method for manufacturing the input assembly includes: mounting the fingerprint chip package structure in the decoration enclosure; mounting the decoration enclosure carried with the fingerprint chip package structure in the blind hole and abutting the protrusion portion against the lower surface of the touch panel; mounting the display screen component to the lower surface of the touch panel, in which a first orthographic projection of the display screen component in the lower surface of the touch panel overlaps a second orthographic projection of the decoration enclosure in the lower surface of the touch panel. The method further includes connecting a first flexible circuit board to the fingerprint chip package structure via a wire.

According to a second aspect of embodiments of the present disclosure, there is provided an input assembly. The input assembly includes a decoration enclosure, a touch panel, a fingerprint chip package structure and a display screen component. The touch panel defines a blind hole in a lower surface thereof. The decoration enclosure includes a decoration ring. The decoration ring is provided with a muff-coupling portion connected to a bottom surface of the decoration ring. The muff-coupling portion is provided with a flange fitted over the muff-coupling portion. The flange includes a protrusion portion protruding from an outer wall of the decoration enclosure. The flange and the decoration ring are configured as separate structures. The input assembly is manufactured by a method including: mounting the fingerprint chip package structure in the decoration enclosure; mounting the decoration enclosure carried with the fingerprint chip package structure in the blind hole and abutting the protrusion portion against the lower surface of the touch panel; and mounting the display screen component to the lower surface of the touch panel, in which a first orthographic projection of the display screen component in the lower surface of the touch panel overlaps a second orthographic projection of the decoration enclosure in the lower surface of the touch panel. The method further includes connecting a first flexible circuit board to the fingerprint chip package structure via a wire.

According to a third aspect of embodiments of the present disclosure, there is provided a terminal, including an input assembly. The input assembly includes a decoration enclosure, a touch panel, a fingerprint chip package structure and a display screen component. The touch panel defines a blind hole in a lower surface thereof. The decoration enclosure includes a decoration ring. The decoration ring is provided with a muff-coupling portion connected to a bottom surface of the decoration ring. The muff-coupling portion is provided with a flange fitted over the muff-coupling portion. The flange includes a protrusion portion protruding from an outer wall of the decoration enclosure. The flange and the decoration ring are configured as separate structures. The input assembly is manufactured by a method including: mounting the fingerprint chip package structure in the decoration enclosure; mounting the decoration enclosure carried with the fingerprint chip package structure in the blind hole and abutting the protrusion portion against the lower surface of the touch panel; and mounting the display screen component to the lower surface of the touch panel, in which a first orthographic projection of the display screen component in the lower surface of the touch panel overlaps a second orthographic projection of the decoration enclosure in the lower surface of the touch panel. The method further includes connecting a first flexible circuit board to the fingerprint chip package structure via a wire.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to following drawings.

DETAILED DESCRIPTION

Figure 1:
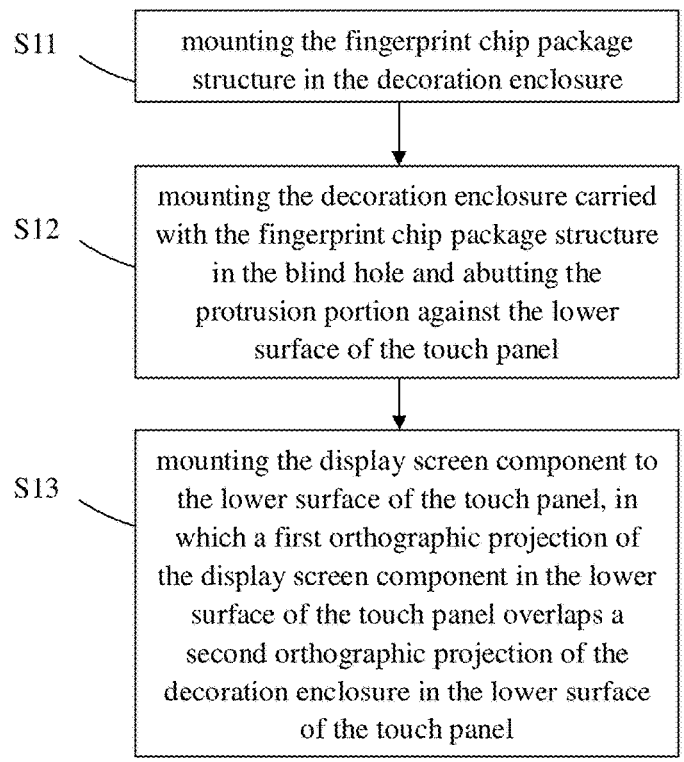
FIG. 1 is a flow chart of a method for manufacturing an input assembly according to embodiments of the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the specification, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise" and "counterclockwise" should be construed to refer to the orientation as then described or as shown in the drawings under discussion. These relative terms are for convenience of description and do not require that the present invention be constructed or operated in a particular orientation. In addition, terms such as "first" and "second" are used herein for purposes of description and are not intended to indicate or imply relative importance or significance or to imply the number of indicated technical features. Thus, the feature defined with "first" and "second" may comprise one or more of this feature. In the description of the present invention, "a plurality of" means two or more than two, unless specified otherwise.

In the present invention, unless specified or limited otherwise, the terms "mounted", "connected", "coupled", "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

Various embodiments and examples are provided in the following description to implement different structures of the present disclosure. In order to simplify the present disclosure, certain elements and settings will be described. However, these elements and settings are only by way of example and are not intended to limit the present disclosure.

In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Referring to FIGS. 1-5, a method for manufacturing an input assembly is provided by embodiments of the present disclosure. The input assembly 100 includes a decoration enclosure 102, a touch panel 104, a fingerprint chip package structure 106 and a display screen component 107. A lower surface 108 of the touch panel 104 defines a blind hole 112. The method for manufacturing the input assembly can include actions at following blocks.

At block S11, the fingerprint chip package structure 106 is mounted in the decoration enclosure 102.

At block S12, the decoration enclosure 102 carried with the fingerprint chip package structure 106 is mounted in the blind hole 112.

At block S13, the display screen component 107 is mounted to the lower surface 108 of the touch panel 104. A first orthographic projection of the display screen component 107 in the lower surface 108 overlaps a second orthographic projection of the decoration enclosure 102 in the lower surface 108.

Hence, in the method for manufacturing the input assembly according to embodiments of the present disclosure, the decoration enclosure 102 and the fingerprint chip package structure 106 are assembled together and then are mounted in the blind hole 112, so that an assembling efficiency of the fingerprint chip package structure 106 is high, thereby improving the production efficiency of the input assembly and the terminal as well as reducing costs of the input assembly and the terminal. Also, a first orthographic projection of the display screen component 107 in the lower surface 108 overlaps a second orthographic projection of the decoration enclosure 102 in the lower surface 108, as indicated by a region limited between two dotted lines in FIG. 5.

In some embodiments, the first orthographic projection of the display screen component 107 in the lower surface 108 may completely overlap the second orthographic projection of the decoration enclosure 102 in the lower surface 108, but the present disclosure is not limited to this. For example, in other embodiments, the first orthographic projection of the display screen component 107 in the lower surface 108 may partially overlap the second orthographic projection of the decoration enclosure 102 in the lower surface 108.

Figure 2:
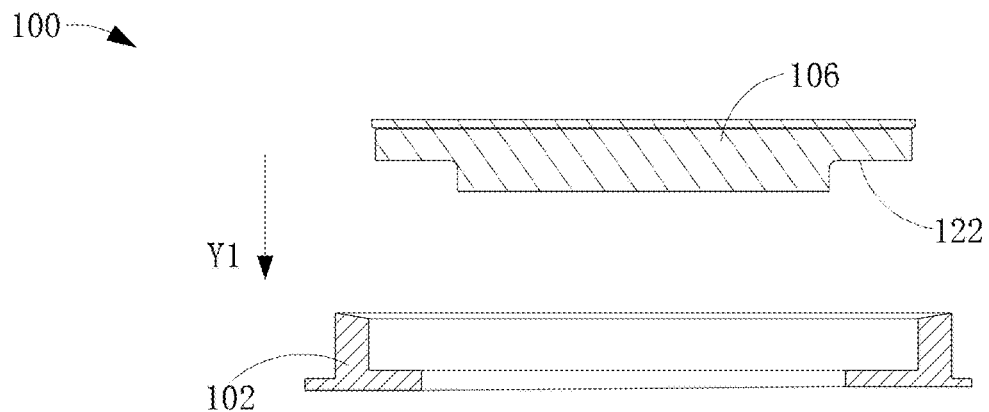
FIGS. 2-6 are schematic views showing a process of a method for manufacturing an input assembly according to embodiments of the present disclosure.

In embodiments of the present disclosure, during mounting the fingerprint chip package structure 106 to the decoration enclosure 102, the fingerprint chip package structure 106 can be mounted downwards along a direction shown by arrow Y1 in FIG. 2. During mounting the decoration enclosure 102 carried with the fingerprint chip package structure 106 to the blind hole 112, the decoration enclosure 102 carried with the fingerprint chip package structure 106 can be mounted upwards along a direction shown by arrow Y2 in FIG. 3.

Figure 10:
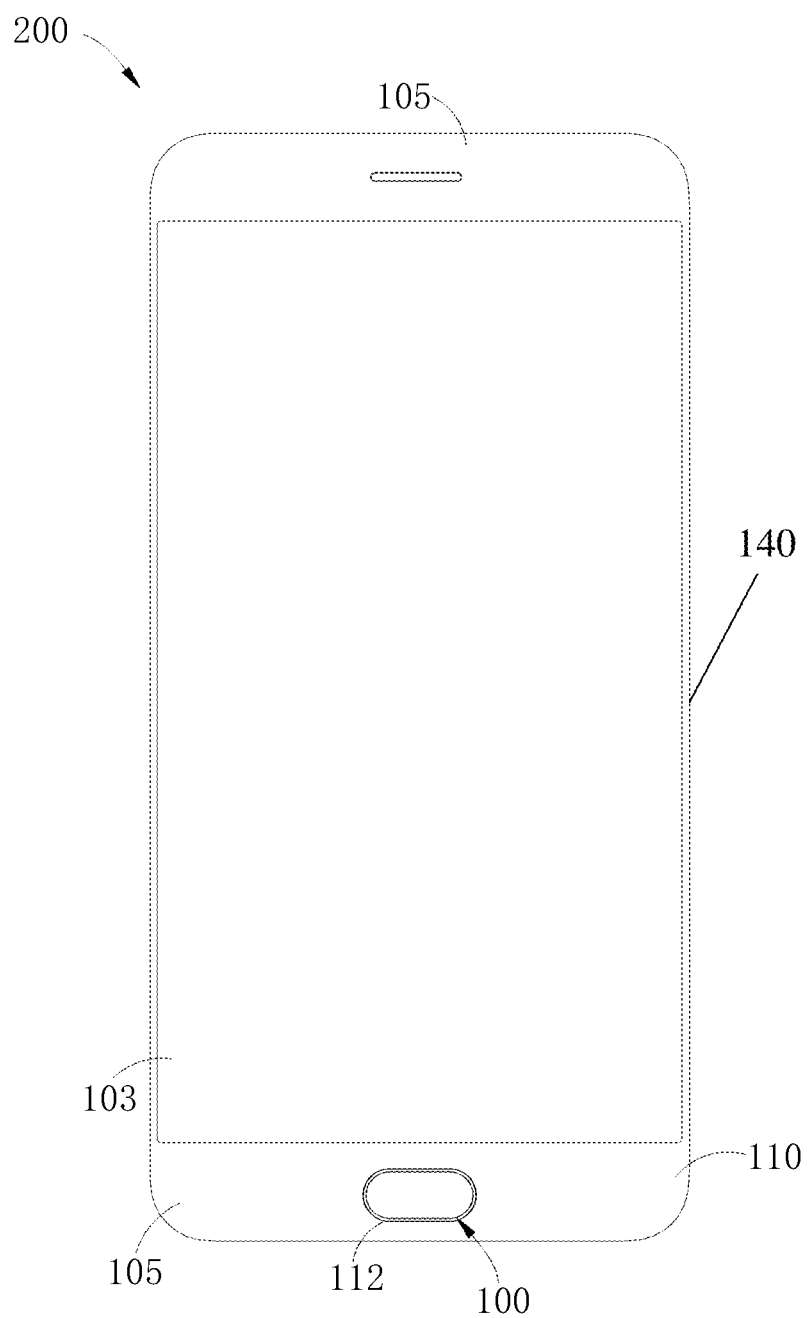
FIG. 10 is a plan view of a terminal according to embodiments of the present disclosure.

Referring to FIG. 10, the input assembly 100 manufactured by the method according to embodiments of the present disclosure can be applied to a terminal 200. For example, the terminal 200 can be configured as an electronic device, such as a mobile phone, a tablet, and so on. It can be understood that, the terminal 200 includes but is not limited to examples in the present embodiments.

Generally, the touch panel 104 further includes an upper surface 110. The upper surface 100 is opposite to the lower surface 108. It can be understood that, the upper surface 110 of the touch panel 104 is a facade of the input assembly 100, facing to a user. The user can make gesture operations (for example clicking or sliding) on the upper surface 110, so as to control the terminal 200 to achieve corresponding functions.

Thus, the user can lock the terminal 200 based on a fingerprint, that is, an unauthorized user cannot use the terminal 200. When using the terminal 200, the user can have a fingerprint identification via the input assembly 100 so as to unlock the terminal 200. A shape of the touch panel 104 can be designed specifically according to a shape of the terminal 200, for example being configured to have a rounded rectangle shape.

In the embodiment, when performing an operation to unlock the terminal 200 via the fingerprint, the user can put a finger on the fingerprint chip package structure 106 from the upper surface 110 of the touch panel 104. The fingerprint chip package structure 106 collects a fingerprint pattern of the user and then matches the fingerprint pattern of the user with a prestored fingerprint pattern. If the matching is successful, the terminal will be unlocked. In addition, a region identification 101 can be provided in a region of the upper surface 110 corresponding to the fingerprint chip package structure 106, so as to facilitate the user to determine a position in which the finger is placed during the fingerprint identification.

In some embodiments, the fingerprint chip package structure 106 can include a fingerprint chip package body and a cover plate. The cover plate is located on the fingerprint chip package body and is configured to be touched by the finger of the user, so as to achieve a fingerprint collection of the fingerprint chip package structure 106.

The fingerprint chip package body includes a fingerprint identification chip and a package body, and the package body packages the fingerprint identification chip so as to protect the fingerprint identification chip from being damaged.

The touch panel 104 can be made of light-transparent materials, such as glasses, ceramics or sapphires. Since the touch panel 104 is configured as an input part of the terminal, the touch panel 104 always suffers touches, such as impacts or scratches. For example, when the user puts the terminal into his/her pocket, the touch panel 104 can be scratched and damaged by keys in the pocket of the user.

The touch panel 104 can be made of materials having high hardness, such as the above-mentioned sapphires.

In general, the touch panel 104 includes a display region 103 and a non-display region 105. The display region 103 can be used for the user to view content displayed in the display screen component 107. In some embodiments, the display screen component 107 can include a screen, and the content to be viewed is displayed in the screen. The non-display region 105 is located at at least one of two ends (for example a top end and a bottom end) of the touch panel 104 along a length direction of the touch panel 104. For example, as shown in FIG. 10, two non-display regions 105 are provided at the top end and the bottom end of the touch panel 104 respectively.

Figure 3:
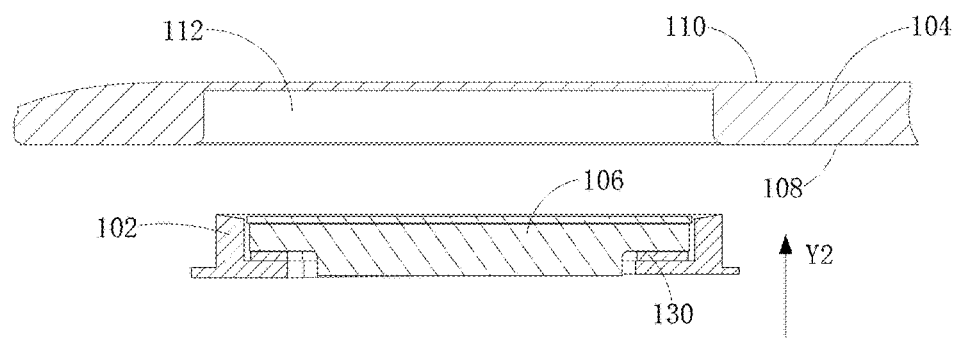
Figure 4:
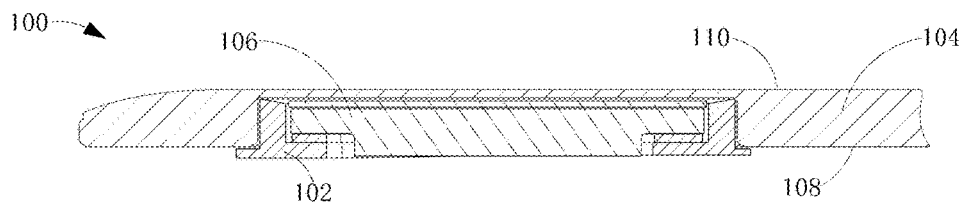

The blind hole 112 of the touch panel 104 is formed in the bottom end of the touch panel 104 (for example a left end of the touch panel 104 shown in FIG. 3). Thus, it is convenient for the user to put his/her thumb on the fingerprint chip package structure 106.

Figure 6:
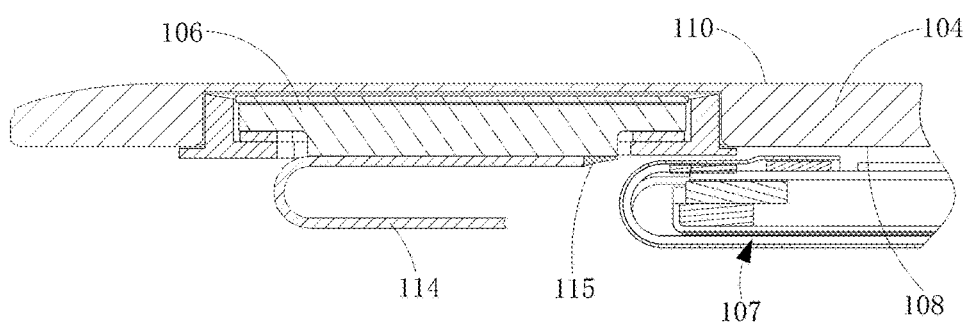

In some embodiments, referring to FIG. 6, the method for manufacturing the input assembly further includes an action that a first flexible circuit board 114 is coupled to the fingerprint chip package structure 106 via a wire.

Thus, a fingerprint signal collected by the fingerprint chip package structure 106 can be output to other processing devices so as to identify the fingerprint. Moreover, the flexible circuit board 114 can also make full use of space in the input assembly 100 due to flexibility of the flexible circuit board 114, thereby contributing to miniaturization of the input assembly 100.

In some embodiments of the present disclosure, a surface of the first flexible circuit board 114 can be provided with a circuit board connecting pad, and a bottom surface of the fingerprint chip package structure 106 can be provided with a chip connecting pad. The circuit board connecting pad can be coupled to the chip connecting pad by a wire through a wire-bonding process, so as to achieve an electric connection between the flexible circuit board 114 and the fingerprint chip package structure 106. The above-mentioned connecting pads can form circuit connection points.

In some embodiments, the action that the first flexible circuit board 114 is coupled to the fingerprint chip package structure 106 via the wire can be implemented before, after or at the same time with the action that the display screen component 107 is mounted to the lower surface 108, which can be operated specifically according to actual situations.

In some embodiments, referring to FIG. 6, the method for manufacturing the input assembly further includes an action that packaging materials 115 are used to package the wire, the circuit connection point of the fingerprint chip package structure 106 and the circuit connection point of the first flexible circuit board 114.

Thus, the input assembly 100 has a good appearance, and also the circuit connection point of the fingerprint chip package structure 106, the circuit connection point of the first flexible circuit board 114 and the wire can be prevented from being decoupled and failed due to oxidation.

Figure 5:
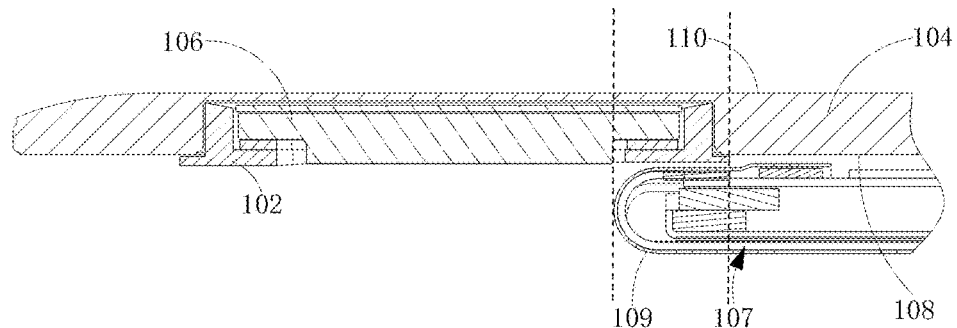

In some embodiments, referring to FIG. 5, the display screen component 107 further includes a second flexible circuit board 109 coupled to the screen. The first orthographic projection includes a third orthographic projection of the second flexible circuit board 109 in the lower surface 108, and the third orthographic projection overlaps the second orthographic projection.

Thus, since the second flexible circuit board 109 is used as a connection circuit board of the display screen component 107, a more flexible space configuration in the input assembly 100 can be achieved, and it is easy for the orthographic projection of the second flexible circuit board in the lower surface 108 to overlap that of the decoration enclosure 102 in the lower surface 108.

In embodiments of the present disclosure, the second flexible circuit board 109 can firstly extend to a position underneath the decoration enclosure 102 along a direction from the display region 103 to the non-display region 105 (for example, a direction from right to left in FIG. 5), and then turn back along a direction from the non-display region 105 to the display region 103. Thus, the second flexible circuit board 109 can be configured as a bent second flexible circuit board 109, and parts of the display screen component 107 and/or parts of the terminal 200 can be placed in a space formed by the bent second flexible circuit board 109, thereby further miniaturizing the input assembly 100 and the terminal 200.

The above structure can also allow the decoration enclosure 102 to be closer to the display region 103. Even, the decoration enclosure 102 can be partially or entirely in the display region 103 of the touch panel 104, so as to reduce a ratio of an area of the non-display region 105 to an area of the touch panel 104 and to increase a ratio of an area of the display region 103 to the area of the touch panel 104.

In some embodiments, the action that the fingerprint chip package structure 106 is mounted in the decoration enclosure 102 includes followings:

a first adhesive is injected between the fingerprint chip package structure 106 and the decoration enclosure 102, and the first adhesive is adhered to the fingerprint chip package structure 106 and the decoration enclosure 102; and the first adhesive is solidified so that the fingerprint chip package structure 106 is fixed in the decoration enclosure 102.

Thus, positions of the fingerprint chip package structure 106 and the decoration enclosure 102 are fixed relative to each other, thereby preventing the fingerprint chip package structure 106 from shaking during use, so as not to influence a using effect.

In some embodiments, the first adhesive can be a light-solidification adhesive, such as a UV adhesive. The first adhesive in a liquid state can be firstly injected into a gap between the fingerprint chip package structure 106 and the decoration enclosure 102 via a glue dispenser. After the first adhesive fills the gap uniformly, the first adhesive is solidified by means of lighting, so that the positions of the fingerprint chip package structure 106 and the decoration enclosure 102 are fixed relative to each other. In some embodiments, before the lighting, a shielding means can be adopted to shield some elements which can be influenced by the lighting.

In some embodiments, the action that the decoration enclosure 102 carried with the fingerprint chip package structure 106 is mounted in the blind hole 112 includes followings:

at least one of an outer circumferential edge of the decoration enclosure 102 and an inner wall of the blind hole 112 is coated with a second adhesive;

the decoration enclosure 102 carried with the fingerprint chip package structure 106 is mounted in the blind hole 112 and the second adhesive is adhered to the outer circumferential edge of the decoration enclosure 102 and the inner wall of the blind hole 112; and the second adhesive is solidified so that the decoration enclosure 102 is fixed in the blind hole 112.

Thus, the decoration enclosure 102 carried with the fingerprint chip package structure 106 can be fixed to the touch panel 104, thereby preventing the decoration enclosure 102 from shaking during use, so as not to influence the using effect.

In some embodiments, the second adhesive can be the light-solidification adhesive, such as the UV adhesive. Firstly, the outer circumferential edge of the decoration enclosure 102 can be coated with the second adhesive in a liquid state, or the inner wall of the blind hole 112 can be coated with the second adhesive in the liquid state, or both the outer circumferential edge of the decoration enclosure 102 and the inner wall of the blind hole 112 can be coated with the second adhesive in the liquid state.

After the second adhesive spreads uniformly, the decoration enclosure 102 carried with the fingerprint chip package structure 106 is mounted in the blind hole 112 and the second adhesive is adhered to the outer circumferential edge of the decoration enclosure 102 and the inner wall of the blind hole 112. Then, the second adhesive is solidified by means of lighting, and thus positions of the decoration enclosure 102 and the touch panel 104 can be fixed relative to each other. In some embodiments, before the lighting, a shielding means can be adopted to shield some elements which can be influenced by the lighting.

In some embodiments, the fingerprint chip package structure 106 is provided with a recessed portion 122 and the decoration enclosure 102 includes a support rim 124. The support rim 124 protrudes from an inner wall of the decoration enclosure 102. The action that the fingerprint chip package structure 106 is mounted in the decoration enclosure 102 includes that the recessed portion 122 is mounted towards the support rim 124 and the fingerprint chip package structure 106 is supported on the support rim 124 through the recessed portion 122.

Thus, the fingerprint chip package structure 106 can be supported when mounted in the decoration enclosure 102, thereby facilitating proceeding of subsequent processes.

Figure 7:
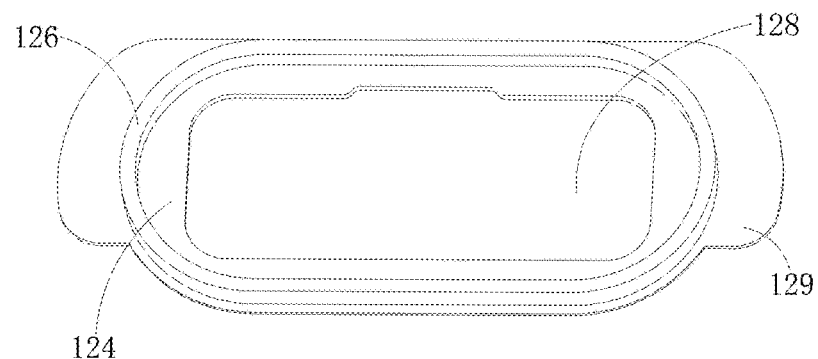
FIG. 7 is an isometric view of a decoration enclosure of an input assembly according to embodiments of the present disclosure.

In some embodiments, referring to FIG. 7, the decoration enclosure 102 includes a decoration ring 126 and the support rim 124, and the support rim 124 is formed by extending inwards from a bottom end of the decoration ring 126. Therefore, a middle part of the decoration enclosure 102 defines a stepped through hole 128.

The fingerprint chip package structure 106 includes a bottom surface and a lateral surface connected to the bottom surface. The recessed portion 122 is formed at a junction of the bottom surface and the lateral surface, so that a cross section of the fingerprint chip package body of the fingerprint chip package structure 106 has a T shape. When the fingerprint chip package structure 106 is mounted in the decoration enclosure 102, the fingerprint chip package structure 106 is located in the stepped through hole 128, and the recessed portion 122 and the support rim 124 are fitted with each other so as to support the fingerprint chip package structure 106. Moreover, a mutual fit between the recessed portion 122 and the support rim 124 contributes to reducing a total thickness of the fingerprint chip package structure 106 and the decoration enclosure 102 assembled together.

Furthermore, a thickness of a portion of the support rim 124 close to the display region 103 (the display region 103 is located at right, as shown in FIG. 6) is relatively small, thus saving much space for parts related to the display screen component 107.

In some embodiments, the recessed portion 122 is configured to be fitted with the support rim 124, that is, the support rim 124 is configured to be accommodated in the recessed portion 122, so that the fingerprint chip package structure 106 is supported on the support rim 124 through the recessed portion 122.

In the present embodiment, the recessed portion 122 is configured as an annular structure, and correspondingly, the support rim 124 is configured as an annular structure as well, so that the recessed portion 122 can accommodate the support rim 124.

In other embodiments, a plurality of recessed portions 122 spaced apart from one another in a circumferential direction of the junction of the bottom surface and the lateral surface can be provided. Correspondingly, a plurality of support rims 124 spaced apart from one another in the circumferential direction can also be provided. The plurality of recessed portions 122 are fitted with the plurality of support rims 124 correspondingly.

For example, three recessed portions 122 are provided, and two adjacent recessed portions 122 are spaced apart from each other by 120° in the circumferential direction. Three support rims 124 are also provided, and the three support rims 124 are corresponding to the three recessed portions 122 with respect to the structural position.

In some embodiments, the shapes and the numbers of the recessed portions 122 and the support rims 124 are not limited to the above-mentioned cases, as long as the recessed portion 122 is fitted with the support rim 124 so that the support rim 124 can support the fingerprint chip package structure 106. Therefore, the above embodiments should not be construed to limit the present disclosure.

Certainly, in other embodiments, when the thickness of the fingerprint chip package structure 106 is relatively small, the recessed portion 122 can be omitted from the fingerprint chip package structure 106.

In addition, the decoration enclosure 102 is provided with a protrusion portion 129 protruding from an outer wall of the decoration enclosure 102. The protrusion portion 129 can play a role of sealing the gap between the decoration enclosure 102 and the touch panel 104. Furthermore, when the decoration enclosure 102 is mounted into the blind hole 112 from down to up, if the protrusion portion 129 abuts against the lower surface 108 of the touch panel 104, it indicates that the decoration enclosure 102 is mounted to a preset position. Therefore, the protrusion portion 129 is provided to improve the assembling efficiency of the input assembly 100 and to reduce the production cost of the input assembly 100.

In embodiments of the present disclosure, the protrusion portion 129 is formed on an outer wall of the decoration ring 126 and configured to be annular.

In the embodiment shown in FIG. 7, the decoration enclosure 102 is configured as an integrally molded structure.

Figure 8:
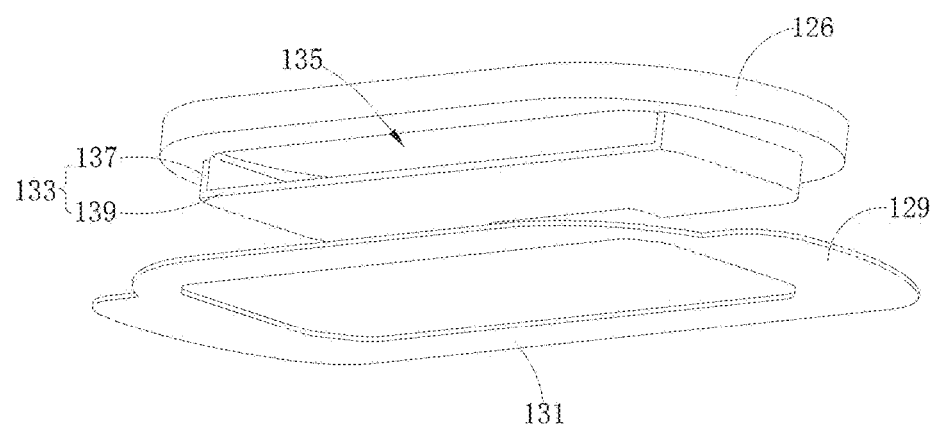
FIG. 8 is an exploded view of a decoration enclosure of an input assembly according to embodiments of the present disclosure.
Figure 9:
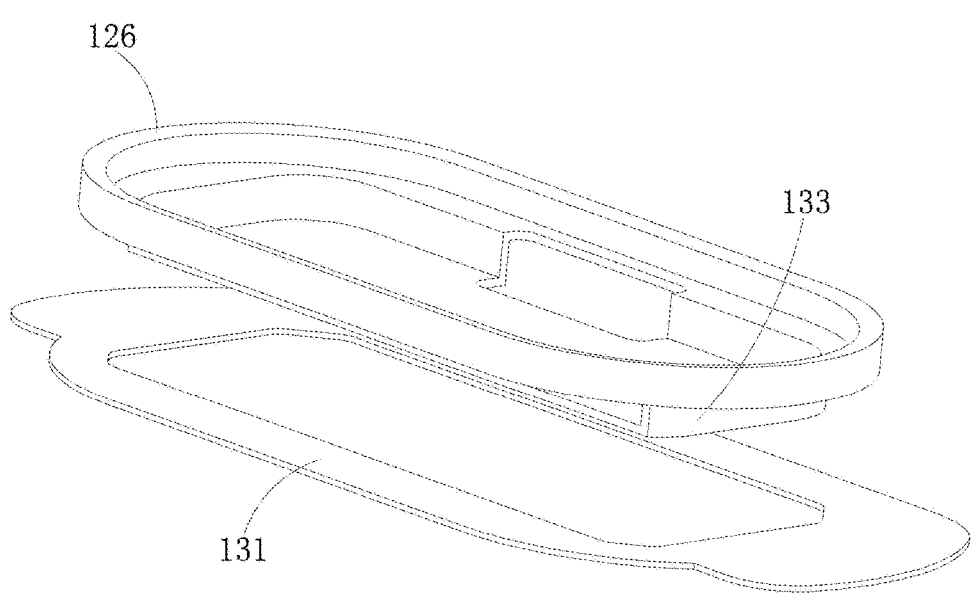
FIG. 9 is an exploded view of a decoration enclosure of an input assembly along another direction according to embodiments of the present disclosure.

In embodiments shown in FIG. 8 and FIG. 9, the decoration enclosure 102 is configured as a detachable structure. In some embodiments, the protrusion portion 129 can be configured as a part of a flange 131, and the decoration ring 126 is provided with a muff-coupling portion 133 connected to a bottom surface of the decoration ring 126. For example, the flange 131 can be fitted over the muff-coupling portion 133 by an interference fit. Since the flange 131 and the decoration ring 126 are separately molded, production difficulties of the decoration enclosure 102 can be reduced, so that uniformity of each decoration enclosure 102 can be improved when the decoration enclosure 102 is put into mass production.

In some embodiments, the muff-coupling portion 133 can define a via hole 135 through which the first flexible circuit board 114 can run.

In some embodiments, the muff-coupling portion 133 includes a connecting rim 137 and a bearing plate 139. The connecting rim 137 is connected to the support rim 124 and the bearing plate 139. The connecting rim 137 is substantially perpendicular to the support rim 124. The bearing plate 139 is substantially perpendicular to the connecting rim 137. The connecting rim 137 defines the via hole 135.

The muff-coupling portion 133 is hollow, so as to accommodate a part or a whole of the fingerprint chip package structure 106. In some embodiments, the fingerprint chip package structure 106 can be supported on the bearing plate 139.

In some embodiments, the method for manufacturing the input assembly further includes an action that a sealing member 130 is adhered in the recessed portion 122 or on the support rim 124, so that the sealing member 130 can seal a gap between the recessed portion 122 and the support rim 124 when the fingerprint chip package structure 106 is mounted in the decoration enclosure 102.

Thus, outside vapor and dust can be prevented from entering the input assembly 100 via the gap between the fingerprint chip package structure 106 and the decoration enclosure 102, thereby ensuring the reliability of the input assembly 100.

In embodiments of the present disclosure, the support rim 124 is an annular support rim. Correspondingly, the recessed portion 122 and the sealing member 130 are configured to be annular as well.

Referring to FIG. 6, an input assembly 100 is provided by embodiments of the present disclosure, and the input assembly 100 is manufactured by a method for manufacturing an input assembly according to any one of the above embodiments.

As the efficiency of the method for manufacturing the input assembly according to embodiments of the present disclosure is high, the input assembly 100 according to embodiments of the present disclosure has a low cost. Moreover, the input assembly 100 also has a compact structure.

Figure 11:
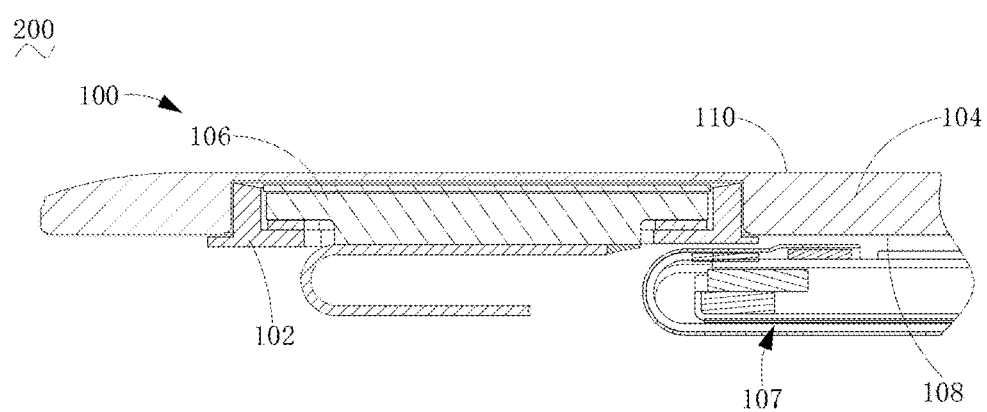
FIG. 11 is a sectional view of a terminal according to embodiments of the present disclosure.

Referring to FIG. 10 and FIG. 11, a terminal 200 is provided by embodiments of the present disclosure, including an input assembly 100 and a shell configured to enclose the input assembly therein. The input assembly 100 is manufactured by a method for manufacturing an input assembly according to any one of the above embodiments.

As the efficiency of the method for manufacturing the input assembly according to embodiments of the present disclosure is high, the terminal 200 according to embodiments of the present disclosure has a low cost. Moreover, the terminal 200 also has a compact structure.

In some embodiments, the terminal 200 can be configured as an electronic device, such as a mobile phone or a tablet. It can be understood that, the terminal 200 includes but is not limited to examples of the present embodiment.

During the fingerprint identification, the user can put the finger on the upper surface 110 of the touch panel 104 and touch the fingerprint chip package structure 106, so as to achieve the fingerprint collection and identification.

Reference throughout this specification to "an embodiment", "some embodiments", "one embodiment", "another example", "an example", "a specific example" or "some examples" means that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example", "in an example", "in a specific example" or "in some examples" in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for manufacturing an input assembly, the input assembly comprising a decoration enclosure, a touch panel, a fingerprint chip package structure and a display screen component, the touch panel defining a blind hole in a lower surface thereof, the decoration enclosure comprising a decoration ring, the decoration ring being provided with a muff-coupling portion connected to a bottom surface of the decoration ring, the muff-coupling portion being provided with a flange fitted over the muff-coupling portion, the flange comprising a protrusion portion protruding from an outer wall of the decoration enclosure, the flange and the decoration ring being configured as separate structures and the method for manufacturing the input assembly comprising:

mounting the fingerprint chip package structure in the decoration enclosure;

mounting the decoration enclosure carried with the fingerprint chip package structure in the blind hole and abutting the protrusion portion against the lower surface of the touch panel; and mounting the display screen component to the lower surface of the touch panel, wherein a first orthographic projection of the display screen component in the lower surface of the touch panel overlaps a second orthographic projection of the decoration enclosure in the lower surface of the touch panel, wherein the method further comprises connecting a first flexible circuit board to the fingerprint chip package structure via a wire.

2. The method for manufacturing the input assembly according to claim 1, further comprising: using packaging materials to package the wire, a circuit connection point of the fingerprint chip package structure and a circuit connection point of the first flexible circuit board.

3. The method for manufacturing the input assembly according to claim 1, wherein the display screen component comprises a second flexible circuit board, the first orthographic projection comprises a third orthographic projection of the second flexible circuit board in the lower surface of the touch panel, and the third orthographic projection overlaps the second orthographic projection.

4. The method for manufacturing the input assembly according to claim 1, wherein mounting the fingerprint chip package structure in the decoration enclosure comprises:

injecting a first adhesive between the fingerprint chip package structure and the decoration enclosure and adhering the first adhesive to the fingerprint chip package structure and the decoration enclosure; and solidifying the first adhesive so that the fingerprint chip package structure is fixed in the decoration enclosure.

5. The method for manufacturing the input assembly according to claim 1, wherein mounting the decoration enclosure carried with the fingerprint chip package structure in the blind hole comprises:

coating at least one of an outer circumferential edge of the decoration enclosure and an inner wall of the blind hole with a second adhesive;

mounting the decoration enclosure carried with the fingerprint chip package structure in the blind hole and adhering the second adhesive to the outer circumferential edge of the decoration enclosure and the inner wall of the blind hole; and solidifying the second adhesive so that the decoration enclosure is fixed in the blind hole.

6. The method for manufacturing the input assembly according to claim 1, wherein the fingerprint chip package structure is provided with a recessed portion, the decoration enclosure is provided with a support rim, the support rim protrudes from an inner wall of the decoration enclosure, and mounting the fingerprint chip package structure in the decoration enclosure comprises:

mounting the recessed portion towards the support rim and supporting the fingerprint chip package structure on the support rim through the recessed portion.

7. The method for manufacturing the input assembly according to claim 6, further comprising:

adhering a sealing member in the recessed portion or on the support rim, so that the sealing member seals a gap between the recessed portion and the support rim when the fingerprint chip package structure is mounted in the decoration enclosure.

8. An input assembly, comprising a decoration enclosure, a touch panel, a fingerprint chip package structure and a display screen component, the touch panel defining a blind hole in a lower surface thereof, the decoration enclosure comprising a decoration ring, the decoration ring being provided with a muff-coupling portion connected to a bottom surface of the decoration ring, the muff-coupling portion being provided with a flange fitted over the muff-coupling portion, the flange comprising a protrusion portion protruding from an outer wall of the decoration enclosure, the flange and the decoration ring being configured as separate structures and the input assembly being manufactured by a method comprising:

mounting the fingerprint chip package structure in the decoration enclosure;

mounting the decoration enclosure carried with the fingerprint chip package structure in the blind hole and abutting the protrusion portion against the lower surface of the touch panel; and mounting the display screen component to the lower surface of the touch panel, wherein a first orthographic projection of the display screen component in the lower surface of the touch panel overlaps a second orthographic projection of the decoration enclosure in the lower surface of the touch panel, wherein the method further comprises connecting a first flexible circuit board to the fingerprint chip package structure via a wire.

9. The input assembly according to claim 8, wherein the method further comprising using packaging materials to package the wire, a circuit connection point of the fingerprint chip package structure and a circuit connection point of the first flexible circuit board.

10. The input assembly according to claim 8, wherein the display screen component comprises a second flexible circuit board, the first orthographic projection comprises a third orthographic projection of the second flexible circuit board in the lower surface of the touch panel, and the third orthographic projection overlaps the second orthographic projection.

11. The input assembly according to claim 8, wherein mounting the fingerprint chip package structure in the decoration enclosure comprises:

injecting a first adhesive between the fingerprint chip package structure and the decoration enclosure and adhering the first adhesive to the fingerprint chip package structure and the decoration enclosure; and solidifying the first adhesive so that the fingerprint chip package structure is fixed in the decoration enclosure.

12. The input assembly according to claim 8, wherein mounting the decoration enclosure carried with the fingerprint chip package structure in the blind hole comprises:

coating at least one of an outer circumferential edge of the decoration enclosure and an inner wall of the blind hole with a second adhesive;

mounting the decoration enclosure carried with the fingerprint chip package structure in the blind hole and adhering the second adhesive to the outer circumferential edge of the decoration enclosure and the inner wall of the blind hole; and solidifying the second adhesive so that the decoration enclosure is fixed in the blind hole.

13. The input assembly according to claim 8, wherein the fingerprint chip package structure is provided with a recessed portion, the decoration enclosure is provided with a support rim, the support rim protrudes from an inner wall of the decoration enclosure, and mounting the fingerprint chip package structure in the decoration enclosure comprises:

mounting the recessed portion towards the support rim and supporting the fingerprint chip package structure on the support rim through the recessed portion.

14. The input assembly according to claim 13, wherein the method further comprises: adhering a sealing member in the recessed portion or on the support rim, so that the sealing member seals a gap between the recessed portion and the support rim when the fingerprint chip package structure is mounted in the decoration enclosure.

15. A terminal, comprising an input assembly, the input assembly comprising a decoration enclosure, a touch panel, a fingerprint chip package structure and a display screen component, the touch panel defining a blind hole in a lower surface thereof, the decoration enclosure comprising a decoration ring, the decoration ring being provided with a muff-coupling portion connected to a bottom surface of the decoration ring, the muff-coupling portion being provided with a flange fitted over the muff-coupling portion, the flange comprising a protrusion portion protruding from an outer wall of the decoration enclosure, the flange and the decoration ring being configured as separate structures and the input assembly being manufactured by a method comprising:

mounting the fingerprint chip package structure in the decoration enclosure;

mounting the decoration enclosure carried with the fingerprint chip package structure in the blind hole and abutting the protrusion portion against the lower surface of the touch panel; and mounting the display screen component to the lower surface of the touch panel, wherein a first orthographic projection of the display screen component in the lower surface of the touch panel overlaps a second orthographic projection of the decoration enclosure in the lower surface of the touch panel, wherein the method further comprises connecting a first flexible circuit board to the fingerprint chip package structure via a wire.

16. The terminal according to claim 15, wherein the display screen component comprises a second flexible circuit board, the first orthographic projection comprises a third orthographic projection of the second flexible circuit board in the lower surface of the touch panel, and the third orthographic projection overlaps the second orthographic projection.

17. The terminal according to claim 15, wherein mounting the fingerprint chip package structure in the decoration enclosure comprises:

injecting a first adhesive between the fingerprint chip package structure and the decoration enclosure and adhering the first adhesive to the fingerprint chip package structure and the decoration enclosure; and solidifying the first adhesive so that the fingerprint chip package structure is fixed in the decoration enclosure.

18. The terminal according to claim 15, wherein mounting the decoration enclosure carried with the fingerprint chip package structure in the blind hole comprises:

coating at least one of an outer circumferential edge of the decoration enclosure and an inner wall of the blind hole with a second adhesive;

mounting the decoration enclosure carried with the fingerprint chip package structure in the blind hole and adhering the second adhesive to the outer circumferential edge of the decoration enclosure and the inner wall of the blind hole; and solidifying the second adhesive so that the decoration enclosure is fixed in the blind hole.

19. The terminal according to claim 15, wherein the fingerprint chip package structure is provided with a recessed portion, the decoration enclosure is provided with a support rim, the support rim protrudes from an inner wall of the decoration enclosure, and mounting the fingerprint chip package structure in the decoration enclosure comprises:

mounting the recessed portion towards the support rim and supporting the fingerprint chip package structure on the support rim through the recessed portion.

20. The terminal according to claim 19, wherein the method further comprises: adhering a sealing member in the recessed portion or on the support rim, so that the sealing member seals a gap between the recessed portion and the support rim when the fingerprint chip package structure is mounted in the decoration enclosure.

* * * * *